United States Patent
Sawada et al.

(10) Patent No.: US 10,109,390 B2
(45) Date of Patent: Oct. 23, 2018

(54) CONDUCTIVE FILM, AND TOUCH PANEL, DISPLAY, TOUCH SENSOR, AND SOLAR CELL USING THE SAME

(71) Applicant: Panasonic Intellectual Property Management Co., Ltd., Osaka (JP)

(72) Inventors: Tomoaki Sawada, Osaka (JP); Takatoshi Abe, Osaka (JP); Shingo Yoshioka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 99 days.

(21) Appl. No.: 15/447,039

(22) Filed: Mar. 1, 2017

(65) Prior Publication Data
US 2017/0271043 A1 Sep. 21, 2017

(30) Foreign Application Priority Data
Mar. 15, 2016 (JP) .................... 2016-051013

(51) Int. Cl.
*H01B 5/14* (2006.01)
*H01B 1/24* (2006.01)
(Continued)

(52) U.S. Cl.
CPC .............. *H01B 5/14* (2013.01); *B32B 27/06* (2013.01); *B32B 27/12* (2013.01); *B32B 27/36* (2013.01); *H01B 1/24* (2013.01); *H01L 31/022466* (2013.01); *H01L 31/03926* (2013.01); *H03K 17/96* (2013.01); *B32B 2250/02* (2013.01); *B32B 2255/10* (2013.01); *B32B 2255/26* (2013.01); *B32B 2262/106* (2013.01); *B32B 2307/202* (2013.01); *B32B 2307/538* (2013.01); *B32B 2307/54* (2013.01);
(Continued)

(58) Field of Classification Search
CPC ....... H01B 5/14; H01B 1/24; H01L 31/03926; H01L 31/022466; H03K 17/96; H03K 17/9645; Y02E 10/50; B32B 27/12; B32B 27/36; B32B 27/06; B32B 2457/12; B32B 2307/732; B32B 2307/54; B32B 2262/106; B32B 2255/26; B32B 2255/10; B32B 2250/02; B32B 2457/20; B32B 2309/105; B32B 2307/538; B32B 2307/202; B32B 2457/208
See application file for complete search history.

(56) References Cited

U.S. PATENT DOCUMENTS

| 7,626,128 B2 | 12/2009 | Takada et al. |
| 2010/0247810 A1 | 9/2010 | Yukinobu et al. |

(Continued)

FOREIGN PATENT DOCUMENTS

| EP | 560380 | 9/1993 |
| JP | 2009-163959 | 7/2009 |

(Continued)

*Primary Examiner* — Nathan L Van Sell
(74) *Attorney, Agent, or Firm* — Greenblum & Bernstein, P.L.C.

(57) ABSTRACT

A conductive film includes a film substrate and a conductive layer formed on at least one surface of the film substrate. The film substrate and the conductive film have elongation of 10% or more. Ten-point average roughness Rz of the surface of the film substrate on at least a conductive layer side is 0.05 to 0.5 μm, and an average interval Sm of unevenness is 0.1 to 1 μm.

14 Claims, 2 Drawing Sheets

(51) Int. Cl.
  *B32B 27/12* (2006.01)
  *B32B 27/36* (2006.01)
  *B32B 27/06* (2006.01)
  *H01L 31/0392* (2006.01)
  *H01L 31/0224* (2006.01)
  *H03K 17/96* (2006.01)

(52) U.S. Cl.
  CPC ... *B32B 2307/732* (2013.01); *B32B 2309/105* (2013.01); *B32B 2457/12* (2013.01); *B32B 2457/20* (2013.01); *B32B 2457/208* (2013.01); *H03K 17/9645* (2013.01); *Y02E 10/50* (2013.01)

(56) References Cited

U.S. PATENT DOCUMENTS

| | | |
|---|---|---|
| 2011/0281070 A1 | 11/2011 | Mittal et al. |
| 2011/0291058 A1 | 12/2011 | Kunishi et al. |
| 2015/0373838 A1 | 12/2015 | Sawada et al. |
| 2016/0266668 A1 | 9/2016 | Sawada et al. |

FOREIGN PATENT DOCUMENTS

| | | |
|---|---|---|
| JP | 2010-507199 | 3/2010 |
| JP | 2014-092581 | 5/2014 |
| WO | 2008/046058 | 4/2008 |
| WO | 2009/057637 | 5/2009 |

CONDUCTIVE FILM, AND TOUCH PANEL, DISPLAY, TOUCH SENSOR, AND SOLAR CELL USING THE SAME

BACKGROUND

1. Technical Field

The disclosure relates to a conductive film in which flexibility is provided and a conductive change at a time of extension is suppressed, and to a touch panel, a display, a touch sensor, and a solar cell using the conductive film.

2. Description of the Related Art

Requiring devices or conductive materials such as sensors, displays, artificial skins for robots used in the field of electronics, particularly, various interfaces, for wearability or shape followability is increased. A flexible device which is enabled to be disposed on a curved surface, an uneven surface, or the like, and to be freely deformed is being required in accordance with a use.

As one of such a conductive material, until now, a film or glass using indium-tin oxide (ITO) is widely used as a transparent conductive material for a display. However, the ITO film has insufficient flexibility. Thus, there is a problem in that, if the ITO film is deformed, for example, bent or extended, electric resistance is largely changed, or disconnection occurs. Accordingly, as a conductive film having flexibility, a transparent conductive film formed to maintain a shape in which carbon nanotubes are highly dispersed has been researched and developed (PCT International Publication No. WO2009/057637 and Japanese Patent Unexamined Publication No. 2009-163959).

Such a conductive film using the carbon nanotube uses a plastic base such as a polyethylene terephthalate (PET) film. Thus, the conductive film has excellent bendable properties, and molding by using a mold can be performed onto an uneven surface. However, extension during molding by a mold causes resistance of a conductive layer to be increased or causes conductivity to be damaged. Thus, an increase of resistance at the time of extension is considered as a problem.

A technology (Japanese Patent Unexamined Publication No. 2014-92581) and the like in which a fine uneven shape is formed on the surface of a conductive film in order to impart anti-reflection to the conductive film are known. However, means for suppressing an increase of resistance at the time of extension in a flexible conductive film having extensibility is not reported yet.

SUMMARY

Considering the above-described circumstances, an object of the disclosure is to provide a conductive film in which wearability and shape followability are provided, and electric resistance at a time of extension is changed small.

According to an aspect of the disclosure, there is provided a conductive film which includes a film substrate and a conductive layer formed on at least one surface of the film substrate. The film substrate and the conductive film have elongation of 10% or more. Ten-point average roughness Rz of the surface of the film substrate on at least the conductive layer side is 0.05 to 0.5 µm, and an average interval Sm of unevenness is 0.1 to 1 µm.

According to another aspect of the disclosure, there are provided various devices (display, touch panel, touch sensor, solar cell, and the like) including the conductive film.

According to the disclosure, it is possible to provide a conductive film in which electric resistance is changed small, without losing conductivity in extension. It is considered that it is possible to realize various interface devices such as sensors or displays requiring wearability or shape followability, by using the conductive film which has such characteristics. It is considered that the conductive film can be also applied for a use requiring wearability or shape followability, for example, a flexible battery including a solar cell, a medical field, an in-vehicle field, and the like.

DETAILED DESCRIPTION

Figure 1A:
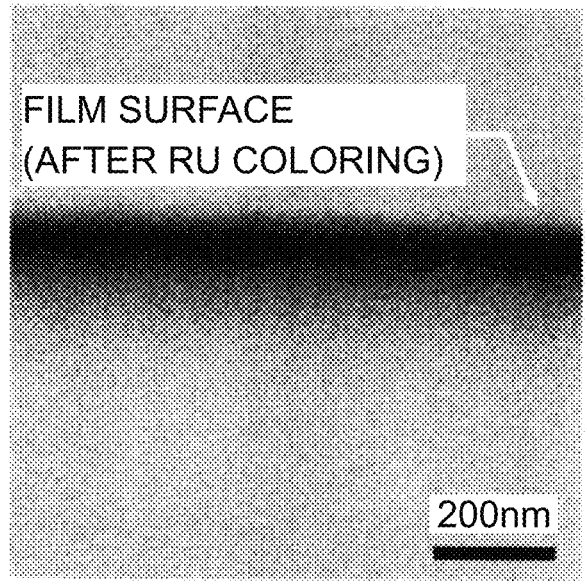
FIG. 1A is a diagram illustrating a TEM image of a film substrate in Example 1-2, before plasma treatment.

As a result obtained by close examination, the inventors found that a conductive layer of a carbon nanotube and the like is formed on a film substrate obtained by forming a predetermined fine unevenness shape on the surface of the film substrate, and thus it is possible to suppress a change of electric resistance at a time of extension. The inventors perform the examination further based on the found knowledge, and thus achieved present embodiments.

Hereinafter, an exemplary embodiment will be specifically described. However, a conductive film according to the disclosure is not limited thereto.

A conductive film according to the exemplary embodiment includes a film substrate and a conductive layer formed on at least one surface of the film substrate. The film substrate and the conductive film have elongation of 10% or more. Ten-point average roughness Rz of the surface of the film substrate on at least the conductive layer side is 0.05 to 0.5 µm, and an average interval Sm of unevenness is 0.1 to 1 µm.

In the exemplary embodiment, having the elongation of 10% or more means that breaking elongation at room temperature (23° C.), which is measured by a test method defined in ISO527-3 is more than 10%. More preferably, it is desirable that the film substrate and the conductive film have the elongation of 30% or more (that is, breaking elongation is more than 30%). An upper limit of the elongation of the film substrate and the conductive film is not particularly limited.

In the exemplary embodiment, the unevenness shape provided on the surface of the film substrate on at least the conductive layer side is defined by Rz (ten-point average roughness) and Sm (average interval of the unevenness) in a case where the film substrate is viewed at a certain location, from a section parallel to a thickness direction.

Here, Rz (ten-point average roughness) is obtained in the following manner. Extraction is performed from a rough curve in a direction of a mean line thereof, by a reference length. A mean value of absolute values of altitudes (set as Yp1, Yp2, Yp3, Yp4, and Yp5 in an order from the highest peak) of peaks from the highest peak to the fifth highest peak in a mean line of the extracted portion is obtained. A mean value of absolute values of altitudes (set as Yv1, Yv2, Yv3, Yv4, and Yv5 in an order from the lowest bottom) of bottoms from the lowest bottom to the fifth lowest bottom in a mean line of the extracted portion is obtained. Rz is the summation of the mean value of absolute values of altitudes of the peaks and the mean value of absolute values of altitudes of the bottoms. That is, Rz is calculated by the following expression.

$$Rz = \frac{|Yp1 + Yp2 + Yp3 + Yp4 + Yp5| + |Yv1 + Yv2 + Yv3 + Yv4 + Yv5|}{5}$$

Sm (average interval of the unevenness) is a mean value of lengths (Sm1, Sm2, . . . , Smi, . . . , and Smn) of n pieces of mean lines which correspond to one crest and one adjacent trough in a portion extracted from a rough curve in a direction of a mean line thereof, by a reference length. That is, Sm is calculated by the following expression.

$$Sm = \frac{1}{n}\sum_{i=1}^{n} Smi$$

A wave shape is not an unevenness shape in a section parallel to the thickness direction of a portion cut out along a crest or a trough of a waveform. Thus, the wave shape is out of a range corresponding to the unevenness shape in the exemplary embodiment. That is, the film substrate in the exemplary embodiment has values of Rz (ten-point average roughness) and Sm (average interval of the unevenness) in the above ranges, in a section parallel to a thickness direction at a certain location, and the film substrate does not have anisotropy.

It is considered that a change of electric resistance at the time of extension can be suppressed in the conductive film in which a conductive layer is formed on the surface of the film substrate having such a fine unevenness shape.

It is more preferable that the conductive layer of the conductive film in the exemplary embodiment has a thickness of about 5 nm to 1 μm. It is considered that the thickness of the conductive layer is set to be in the above range, and thus an effect of suppressing a change of electric resistance at the time of extension is more efficiently obtained.

The thickness being 5 nm to 1 μm means being equal to or more than 5 nm and equal to or less than 1 μm. Being equal to or more than 5 nm includes 5 nm, and being equal to or less than 1 μm includes 1 μm. This is similarly applied to parts using the above description format below.

It is preferable that the conductive layer has a network structure by fibrous conductive nanofiller, and the fibrous conductive nanofiller is, for example, carbon nanotubes, carbon nanofibers, carbon nanobud. A conductor formed from the fibrous conductive nanofiller is used as the conductive layer, and thus it is possible to further suppress a change of electric resistance at the time of extension. Among the conductive nanofiller, from a viewpoint in that an aspect ratio is large (fiber diameter is small and fiber length is long) and conductivity is high, it is preferable that the carbon nanotube is used in the conductive layer.

In a conductive layer using the fibrous conductive nanofiller, a network structure in which a lot of fibrous conductive nanofiller is entangled irregularly, and the fibrous conductive nanofiller is in contact with each other at many contact points is preferably formed. The conductive layer having such a network structure is formed on one surface of a film substrate which can be elastically deformed as will be described later. Thus, the function of the conductive film can be maintained more reliably, without losing conductivity even though deformation occurs at the time of extension or restoration.

As the fibrous conductive nanofiller, a medium in which a fiber length is long and an aspect ratio is large is more preferable. Specifically, fibrous conductive nanofiller in which the fiber length is equal to or more than 1 μm and the aspect ratio indicated by the fiber length for a fiber diameter average is equal to or more than 50 is preferable. Using the nanofiller is effective for maintaining conductivity in spite of deformation at the time of extension or restoration.

The film substrate according to the exemplary embodiment is not particularly limited and may be used as long as the film substrate has the elongation of 10% or more.

It is preferable that the film substrate or the conductive film according to the exemplary embodiment is extendable and restorable.

Being extendable and restorable in the exemplary embodiment means that deformation (extension) occurring by receiving a force can be brought (restored) back to the original if the force is removed. More specifically, even though extension deformation of at least 10% occurs, if the residual distortion rate α when a load applied to the extension is released satisfies 0%≤α≤3%, the conductive film (or film substrate) refers to being extendable and restorable. It is possible to obtain a conductive film which is excellent in restoration properties after extension and is particularly effective when being used in a case where extension and restoration is repeated, since the effect of suppressing the change of electric resistance even though a change occurs by restoration properties after extension is obtained. That is, with the exemplary embodiment, it is possible to suppress a change of electric resistance at the time of restoration, that is, a change of electric resistance when extension and restoration is repeated. Thus, the exemplary embodiment is very useful in an industrial use.

In the exemplary embodiment, for convenience, the residual distortion rate α of the film substrate or the conductive film is defined by an extension-restoration test which will be described later.

Further, it is preferable that the film substrate or the conductive film according to the exemplary embodiment has stress relaxation properties. Here, the stress relaxation properties mean capability of gradually reducing stress applied to the film with elapsed time, when predetermined stress is applied to the film and this state is held.

In the exemplary embodiment, for convenience, the stress relaxation properties of the film substrate or the conductive film are defined by a stress relaxation ratio R which is defined by the extension-restoration test which will be described later.

Preferably, the film substrate or the conductive film in the exemplary embodiment has the stress relaxation ratio R of 30%≤R≤90%.

If the conductive film has a stress relaxation ratio R in such a range, the conductive film has characteristics in that the stress relaxation properties at the time of tension are high. It is considered that the conductive film has excellent wearability and shape followability.

If transparency of the conductive film in the exemplary embodiment is high, the conductive film can be used as the transparent conductive film. If a conductive film having high transparency (70% or higher in total light transmittance, more preferably, 80% to 99%) is used, the conductive film may be appropriately used as a transparent electrode in a display, for example. In the exemplary embodiment, the transparency can be obtained in accordance with selection of a resin or a curing agent thereof used in the film substrate.

If the conductivity of the conductive film in the exemplary embodiment is higher, the conductive film is more appropriate. Generally, the conductive film is used for various uses. In particular, if surface resistance is equal to or smaller than 1000 Ω/sq., the conductive film may be appropriately used as an electrode for a touch sensor, for example.

[Extension-Restoration Test]

In the extension-restoration test used in the exemplary embodiment, a film piece (thickness: 50 μm, sample shape: dumbbell No. 6 (JIS K6251 and ISO37, measured portion width: 4 mm, and parallel part length: 25 mm)) is used. An extension process is performed and then a restoration process is performed, under the following conditions, by using a tensile-compression tester (for example, AUTOGRAPH (model: AGS-X) manufactured by Shimadzu Corporation) based on ISO3384. The stress relaxation ratio R and the residual distortion rate α are computed by the following calculation method.

Extension Process Condition:

Deflection correction is performed with a force of 0.05 N or smaller in order to remove deflection occurring when a test piece is attached to a gripping tool.

Test speed: 25 mm/min until extension of 0% to 25%
Temperature condition: 23° C.

Extension and Holding Process Condition:

Extension and holding condition: holding period of 5 minutes at extension of 25%
Temperature condition: 23° C.

Restoration Process Condition:

Test speed: 0.1 mm/min until a tensile force is 0±0.05 N
Temperature condition: 23° C.

Residual Distortion Rate Calculation Method:

A distortion quantity is measured at a time point when the tensile force is 0±0.05 N in the restoration process, and the measured distortion quantity is set as the residual distortion rate α.

Stress Relaxation Ratio Calculation Method:

In the extension process, a tensile force when the extension process is ended is measured shortly after when a film piece is extended until 25%, and the measured tensile force is set as an initial tensile force $F_{A0}$. Then, in the extension and holding process, a tensile force is measured after when a film piece is held 5 minutes at extension of 25%. The measured tensile force is set as $F_A(t_5)$. The stress relaxation ratio R is computed by the following expression.

$$R = \frac{F_{A0} - F_A(t5)}{F_{A0}} \times 100$$

Regarding a resin composition used in the film substrate in the exemplary embodiment, the composition is not particularly limited as long as a film substrate of a conductive film satisfying the characteristics can be formed.

It is preferable that the film substrate in the exemplary embodiment contains at least a thermosetting resin and a curing agent thereof. Thus, it is considered that it is possible to obtain a conductive film having resistance against a thermal or chemical influence. The usable thermosetting resin is not particularly limited. For example, a phenol resin, a melamine resin, an epoxy resin, a polyimide resin, an unsaturated polyester resin, and the like are exemplified. Among these resins, the epoxy resin is preferably exemplified.

It is preferable that the film substrate in the exemplary embodiment further contains silicon as a constituent. Thus, as will be described later, for example, when an unevenness shape is formed on the surface of the film substrate by plasma irradiation, there is an advantage in that it is possible to form an unevenness which is finer and has a distinct difference in height. Further, it is preferable that the component including silicon is contained to be about 0.1 to 5 mass % in the resin composition constituting the film substrate.

As one of more specific embodiments of the resin composition constituting the film substrate in the exemplary embodiment, for example, a resin composition including (A) polyrotaxane, (B) a thermosetting resin, and (C) a curing agent is exemplified. The component will be more specifically described below.

Polyrotaxane of the (A) component has a molecule having a structure in which a linear axis molecule passes through a cyclic molecule, and a termination is blocked so as not to remove the cyclic molecule. Specifically, for example, polyrotaxane as disclosed in Japanese Patent No. 4482633 is exemplified.

As the polyrotaxane (A) usable in the exemplary embodiment, a compound in which a molecule having a terminal functional group as an axis molecule is included in a cyclic molecule to have a skewered shape, and the terminal functional group is chemically modified by a highly-bulky blocking group which is sufficient for allowing a cyclic molecule not to be separated is exemplified. The structure, the type, an inclusion rate of a cyclic molecule, a manufacturing method, and the like of a molecule constituting the component are not limited as long as the component has such a structure.

The axis molecule which can include polyrotaxane is not particularly limited as long as the axis molecule has a molecular weight of 10,000 or more and the termination thereof can be chemically modified by a blocking group. Examples of the axis molecule include polyvinyl alcohol, polyvinyl pyrrolidone, poly(meth)acrylic acid cellulose resins, polyacrylamide, polyethylene oxide, polyethylene glycol, polypropylene glycol, polyvinyl acetal resins, polyvinyl methyl ether, polyamine, polyethylene imine, casein, gelatin, starch, polyolefin, polyester, polyvinyl chloride, polystyrene, acrylonitrile-styrene copolymer, acrylic resins, polycarbonate, polyurethane, polyvinyl butyral, polyisobutylene, polytetrahydrofuran, polyamide, polyimide, polydiene, polysiloxane, polyurea, polysulfide, polyphosphazene, polyketone, polyphenylene, polyhaloolefin, and derivatives thereof. Among the substances, polyethylene glycol is appropriately used.

The cyclic molecule which may include polyrotaxane is not particularly limited as long as the cyclic molecule is an axis-like molecule which can pass through a polymer molecule, and has at least one reactive group so as to enable a reaction with a crosslinking agent. Specifically, examples of the cyclic molecule include cyclodextrins, crown ethers, cryptands, macrocyclic amines, calixarenes, and cyclophanes. Among the substances, cyclodextrin or substituted cyclodextrin is used, and a substance in which a reactive group (functional group) is further inserted into the substituted structure thereof is more appropriately used.

Examples of the functional group inserted into the cyclic molecule of polyrotaxane preferably include a hydroxyl group, a carboxyl group, an acryl group, a methacryl group, an epoxy group, and a vinyl group.

The functional group inserted into the cyclic molecule as described above can cause cyclic molecules to be cross-linked to each other through a crosslinking agent or cause polyrotaxane and the resin to be cross-linked to each other. Thus, the resin linked to polyrotaxane as described above can achieve flexibility.

The structure (terminal blocking group) in which the termination is blocked in polyrotaxane in the exemplary embodiment is not particularly limited as long as the structure has bulkiness of the degree that the cyclic molecule is not removed. Specifically, for example, a cyclodextrin group, an adamantane group, a dinitrophenyl group, and a trityl group are preferably used.

The substance used as the cyclic molecule is not particularly limited as long as a chain polymer molecule can be included in a ring thereof. As a cyclic molecule which is appropriately used, for example, cyclodextrin is exemplified. It is preferable that the cyclic molecule has a functional group. Further, it is preferable that the functional group is an OH group, an acrylic group, or a methacrylic group.

Polyrotaxane usable in the exemplary embodiment can be synthesized by well-known methods (for example, methods disclosed in PCT International Publication No. WO01/83566, Japanese Patent Unexamined Publication No. 2005-154675, Japanese Patent No. 4482633, and the like). Commercial polyrotaxane may be used. Specifically, for example, SeRM super polymer A1000 and the like manufactured by Advanced Softmaterials Inc. may also be used.

Next, as (B) the thermosetting resin, for example, a thermosetting resin such as an epoxy resin, a phenol resin, a polyimide resin, an urea resin, a melamine resin, an unsaturated polyester, and an urethane resin is exemplified without being particularly limited. Among the substances, an epoxy resin is preferably used.

Specific examples of the epoxy resin include a bisphenol A type epoxy resin, a bisphenol F type epoxy resin, a bisphenol S type epoxy resin, an aralkyl epoxy resin, a phenol novolak type epoxy resin, an alkylphenol novolak type epoxy resin, a biphenol type epoxy resin, a naphthalene type epoxy resin, and a dicyclopentadiene type epoxy resin. For example, an epoxidized matter of a condensate of phenols and aromatic aldehyde having a phenolic hydroxyl group, triglycidyl isocyanurate, and an alicyclic epoxy resin are exemplified. The substances may be singly used or may be used in combination of two types of more, in accordance with a situation.

As the epoxy resin, more preferably, for example, an epoxy resin in which one molecule includes two or more epoxy groups and three methyl groups, and which has a molecular weight of 500 or more is appropriately exemplified. As such an epoxy resin, a commercial epoxy resin may be used. For example, JER1003 (manufactured by Mitsubishi Chemical Corporation, 7 or 8 methyl groups, bifunction, and molecular weight of 1300), EXA-4816 (manufactured by DIC Corporation, molecular weight of 824, many methyl groups, and bifunction), and YP50 (manufactured by NIPPON STEEL & SUMIKIN CHEMICAL CO., LTD., molecular weight of 60000 to 80000, many methyl groups, and bifunction) are exemplified.

The epoxy resin as described above may be singly used or may be used in combination of two types or more.

The (C) curing agent is not particularly limited as long as the curing agent functions as a curing agent of the thermosetting resin of the (B) component. In particular, as the curing agent which can be preferably used as a curing agent of the epoxy resin, for example, a phenol resin, an amine compound, acid anhydride, an imidazole compound, a sulfide resin, and dicyandiamide are exemplified. For example, a photo-UV curing agent, a thermal cationic curing agent, and the like may be also used. The substances may be singly used or may be used in combination of two types of more, in accordance with a situation.

A crosslinking agent may be further added to the resin composition containing polyrotaxane in the exemplary embodiment. Such a crosslinking agent may be used without being particularly limited, as long as the crosslinking agent can make a structure of performing crosslinking with at least a portion (at least one reactive group included in the cyclic molecule of polyrotaxane) of the cyclic molecule of polyrotaxane.

Specific examples of such a crosslinking agent include isocyanate, cyanuric chloride, trimesoyl chloride, terephthaloyl chloride, epichlorohydrin, dibromobenzene, glutaraldehyde, phenylene diisocyanate, tolylene diisocyanate, divinylsulfone, 1,1-carbonyldiimidazole, and alkoxysilane.

In the exemplary embodiment, the number of functional groups provided in the crosslinking agent is not limited. However, in order to crosslink cyclic molecules of polyrotaxane to each other or to crosslink the cyclic molecule and a resin as will be described later, it is desirable that two functional groups or more are provided in one molecule of the crosslinking agent. In a case where the crosslinking agent has a plurality of functional groups, the functional groups may be the same as each other or may be different from each other.

Further, a crosslinking agent having compatibility with polyrotaxane is more preferable. In a case where a substance including a cyclic molecule which has a hydroxyl group is used as polyrotaxane of the (A) component, for example, isocyanates or derivatives thereof are appropriately used as the crosslinking agent. The isocyanate resin is not particularly limited. A blocked isocyanate resin obtained by blocking an isocyanate group may be also used.

In a case where a substance including a cyclic molecule which has an acrylic group or a methacrylic group is used as polyrotaxane of the (A) component, an acrylic resin may be added as a reactive resin. The acrylic resin is also not particularly limited.

The percentages of the components in the resin composition are not particularly limited as long as the effect thereof can be exhibited. However, if the sum of (A), (B), and (C) is set to 100 parts by mass, the (A) polyrotaxane is preferably 10 to 80 parts by mass, and more preferably 30 to 50 parts by mass. The (B) thermosetting resin is preferably 10 to 89.9 parts by mass, and more preferably 30 to 50 parts by mass. The (C) curing agent is preferably 0.1 to 30 parts by mass, and more preferably 0.1 to 20 parts by mass. In a case where the resin composition in the exemplary embodiment contains an isocyanate resin as a crosslinking agent, 0 to 50 parts by mass of the isocyanate resin with respect to (A) polyrotaxane may be added. 10 to 40 parts by mass of the isocyanate resin is preferably added.

The resin composition in the exemplary embodiment may contain other additives, for example, a curing catalyst (curing accelerator), a flame retardant, a flame retardant aid, a leveling agent, and a colorant, if necessary, in a range without damaging the effect.

A preparation method of the resin composition containing polyrotaxane in the exemplary embodiment is not particularly limited. For example, the resin composition in the exemplary embodiment can be obtained by mixing polyrotaxane, the curing agent, the crosslinking agent, the thermosetting resin, and a solvent to be uniform. The solvent to be used is not particularly limited. For example, toluene, xylene, methyl ethyl ketone, and acetone may be used. The solvents may be singly used or may be used in combination of two types or more. If necessary, an organic solvent for adjusting viscosity or various additives may be mixed.

A resin composition obtained in the above-described manner is heated and dried, and thus the resin composition is cured while the solvent is vaporized. Thus, a film substrate in the exemplary embodiment may be obtained.

A method, a device, and conditions for heating and drying the resin composition may correspond to various means similar to those in the related art or correspond to improved means.

A specific heating temperature and a specific heating period may be appropriately set in accordance with, for example, a crosslinking agent or a solvent to be used. For example, heating and drying is performed at a temperature of 50° C. to 200° C. for about 60 to 120 minutes, and thus the resin composition can be cured.

Next, as other specific examples of the resin composition used in the film substrate in the exemplary embodiment, for example, a resin composition which contains (D) an epoxy resin and (E) a curing agent is exemplified. The (D) epoxy resin has characteristics in which a modified group which has 2 to 3 carbon atoms and is subjected to alkylene oxide modification is provided, and the modified group of 4 mols or more are included in epoxy molecules of 1 mol, in which an epoxy group of 2 mols or more is provided, and in which an epoxy equivalent is equal to or more than 450 eq/mol.

As the (D) epoxy resin, specifically, a propylene oxide-added type bisphenol A type epoxy resin (manufactured by ADEKA Corporation, EP4003S), an ethylene oxide-added type hydroxyphenylfluorene type epoxy resin (manufactured by Osaka Gas Chemicals Corporation, EG-280), and the like are exemplified.

The resin composition containing the epoxy resin in the exemplary embodiment may further contain an epoxy resin other than the (D) epoxy resin as described above, in a range without damaging the effect. Examples of the epoxy resin other than the (D) epoxy resin include bisphenol A type epoxy, bisphenol F type epoxy, bisphenol S type epoxy, aralkyl epoxy, aliphatic epoxy, and alicyclic epoxy.

In this case, a mixing percentage of the (D) epoxy resin in the total epoxy resin components is about 60 to 99 mass %, and preferably about 80 to 95 mass %.

As the (E) curing agent, agents which are generally well-known as a curing accelerator for an epoxy resin may be used. Specifically, for example, a substance selected from a phenol resin, acid anhydride, and a sulfonium salt is preferable from a viewpoint of curability. If necessary, a curing accelerator, for example, an imidazole compound, or a combination of two types or more of the curing agents may be used.

As the phenol curing agent, monomers, oligomers, and polymers in which two phenolic hydroxyl groups or more are provided in one molecule may be used. The molecular weight and the molecular structure are not particularly limited. For example, a resin obtained in a manner that at least one of phenols and naphthols, and a compound having an aldehyde group such as formaldehyde are condensed or co-condensed under an acidic catalyst, a phenol aralkyl resin synthesized from at least one of phenols and naphthols, and dimethoxyparaxylene or bis(methoxymethyl)biphenyl, and the like are exemplified. The substances may be singly used or may be used in combination of two types or more.

Here, examples of phenols include phenol, cresol, resorcin, catechol, bisphenol A, bisphenol F, phenylphenol, and aminophenol which include a phenol novolak resin and a cresol novolak resin. Examples of naphthols include α-naphthol, β-naphthol, and dihydroxynaphthalene.

Examples of the acid anhydride curing agent include maleic anhydride, succinic anhydride, itaconic anhydride, citraconic anhydride, phthalic anhydride, 1,2,3,6-tetrahydrophthalic anhydride, 3,4,5,6-tetrahydrophthalic anhydride, hexahydrophthalic anhydride, 4-methyl hexahydrophthalic anhydride, 3-methyl-1,2,3,6-tetrahydrophthalic anhydride, 4-methyl-1,2,3,6-tetrahydrophthalic anhydride, methyl-3,6-endomethylene-1,2,3,6-tetrahydrophthalic anhydride.

Examples of the curing agent of the sulfonium salt include alkylsulfonium salts, benzylsulfonium salts, dibenzylsulfonium salts, and substituted benzylsulfonium salts. Specific examples of the alkylsulfonium salt include 4-acetophenyl dimethylsulfonium hexafluoroantimonate, 4-acetoxyphenyl dimethylsulfonium hexafluoroarsenate, dimethyl-4-(benzyloxy carbonyloxy)phenylsulfonium hexafluoroantimonate, dimethyl-4-(benzoyloxy)phenylsulfonium hexafluoroantimonate, dimethyl-4-(benzoyloxy)phenylsulfonium hexafluoroarsenate, and dimethyl-3-chloro-4-acetoxyphenylsulfonium hexafluoroantimonate. Specific examples of the benzylsulfonium salt include benzyl-4-hydroxyphenyl methylsulfonium hexafluoroantimonate, benzyl-4-hydroxyphenyl methylsulfonium hexafluorophosphate, 4-acetoxyphenyl benzylmethylsulfonium hexafluoroantimonate, benzyl-4-methoxyphenyl methylsulfonium hexafluoroantimonate, benzyl-2-methyl-4-hydroxyphenyl methylsulfonium hexafluoroantimonate, benzyl-3-chloro-4-hydroxyphenyl methylsulfonium hexafluoroarsenate, and 4-methoxybenzyl-4-hydroxyphenyl methylsulfonium hexafluorophosphate. Specific examples of the dibenzylsulfonium salt include dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate, and benzyl-4-methoxybenzyl-4-hydroxyphenylsulfonium hexafluorophosphate. Specific examples of the substituted benzylsulfonium salt include p-chlorobenzyl-4-hydroxyphenyl methylsulfonium hexafluoroantimonate, p-nitrobenzyl-4-hydroxyphenyl methylsulfonium hexafluoroantimonate, p-chlorobenzyl-4-hydroxyphenyl methylsulfonium hexafluorophosphate, p-nitrobenzyl-3-methyl-4-hydroxyphenyl methylsulfonium hexafluoroantimonate, 3,5-dichlorobenzyl-4-hydroxyphenyl methylsulfonium hexafluoroantimonate, and o-chlorobenzyl-3-chloro-4-hydroxy phenylmethylsulfonium hexafluoroantimonate.

The percentages of the components in the resin composition are not particularly limited as long as the effect thereof can be exhibited. However, if the total amount of the resin composition is set to 100 parts by mass, the (D) epoxy resin is 50 to 99 parts by mass, and preferably about 60 to 80 parts by mass. The (E) curing agent is 1 to 50 parts by mass, and preferably about 1 to 40 parts by mass.

The resin composition in the exemplary embodiment may contain other additives, for example, a curing catalyst (curing accelerator), a flame retardant, a flame retardant aid, a leveling agent, and a colorant, if necessary, in a range without damaging the effect.

A preparation method of the resin composition containing the epoxy resin in the exemplary embodiment is not particularly limited. For example, the epoxy resin, the curing agent, and a solvent are mixed to be uniform. The solvent to be used is not particularly limited. For example, toluene, xylene, methyl ethyl ketone, and acetone may be used. The solvents may be singly used or may be used in combination of two types or more. Here, if necessary, an organic solvent for adjusting viscosity or various additives may be mixed.

A resin composition obtained in the above-described manner is heated and dried, and thus the resin composition is cured while the solvent is vaporized. Thus, a film substrate in the exemplary embodiment may be obtained.

A method, a device, and conditions for heating and drying the resin composition may correspond to various means similar to those in the related art or correspond to improved means. A specific heating temperature and a specific heating period may be appropriately set in accordance with, for example, a crosslinking agent or a solvent to be used. For example, heating and drying is performed at a temperature of 130° C. to 200° C. for about 60 to 180 minutes, and thus the resin composition can be cured.

The thickness of a film substrate in the exemplary embodiment, which is obtained in the above-described manner, is not particularly limited. The thickness of 10 μm to 200 μm is preferable from a viewpoint of handling properties, optical characteristics, and wearability.

As a method of forming unevenness on the surface on at least the conductive layer side of the film substrate in the exemplary embodiment, so as to cause the ten-point average roughness Rz to be in a range of 0.05 to 0.5 μm, and cause the average interval Sm of the unevenness to be in a range of 0.1 to 1 μm, well-known methods or improved methods may be used. The method is not particularly limited. Specifically, for example, corona irradiation or plasma irradiation, thermal transfer by a mold in which a fine unevenness shape is formed, forming an unevenness layer by a nanoimprint method, and sand blast treatment using fine particles are exemplified.

In a case using an unevenness forming method, a thermosetting resin, a photocurable resin, or a thermoplastic resin may be used as the purpose for forming unevenness, in a range without damaging elasticity of the film substrate. As other unevenness forming methods, for example, plasma treatment, corona treatment, ashing using light irradiation, or a surface unevenness forming method by dry etching may be used, and a method obtained by applying a lithography method may be used, by using particles of silicon or metal as a mask pattern.

A method other than the above-described methods may be used without being particularly limited, as long as the method is used for forming unevenness of the conductive film in the exemplary embodiment.

A method of forming a conductive layer as described above, on a film substrate having the unevenness shape is not limited. For example, fibrous conductive filler dispersion liquid which has been adjusted by a well-known dispersion method is applied onto the film substrate, and the solvent is vaporized, and thus the conductive layer can be formed. In addition, the conductive layer can be formed by a well-known technology, for example, in which deposition is performed on the film substrate by a dry process. As other forms, the conductive layer can be manufactured by a method in which the conductive layer which has been formed on another base by a well-known technology is transferred onto the film substrate.

Dispersion, a binder component, and other added components which are used in the dispersion liquid may be used for a conductive layer manufactured by the above methods, in a range without damaging characteristics.

When the conductive film in the exemplary embodiment is formed, appropriately, a support such as a PET film may be used. The film substrate is formed on such a support, and a conductive layer is formed on the film substrate by a method as described above, and thus it is possible to obtain the conductive film in the exemplary embodiment.

The conductive layer of the conductive film in the exemplary embodiment is partially removed, and thus patterning can be performed. The removing method is not particularly limited. For example, processing such as laser etching or chemical etching may be performed by general means or general devices.

In the conductive film in the exemplary embodiment, a change of electric resistance occurring by deformation is small in addition to not losing conductivity even in deformation, for example, extension or restoration. Thus, for example, the conductive film in the exemplary embodiment may be appropriately used as an electrode or a wiring circuit, in a display, a touch panel, a touch sensor, a solar cell, and the like.

This specification discloses the technologies having various forms as described above, and the main technology is as follows.

According to an aspect of the disclosure, there is provided a conductive film which includes a film substrate and a conductive layer formed on at least one surface of the film substrate. The film substrate and the conductive film have elongation of 10% or more. Ten-point average roughness Rz of the surface of the film substrate on at least the conductive layer side is 0.05 to 0.5 μm, and an average interval Sm of unevenness is 0.1 to 1 μm.

With such a configuration, it is possible to provide a conductive film in which a change of electric resistance occurring by deformation is smaller than that in the related art, in addition to not losing conductivity in extension.

It is preferable that the thickness of the conductive layer in the conductive film is 5 nm to 1 μm. Thus, it is possible to obtain the effect with higher efficiency. Further, it is considered that the conductive film is advantageous in a viewpoint of transparency and wearability.

It is more preferable that the conductive layer is a conductive layer having a network structure by fibrous conductive nanofiller and the fibrous conductive nanofiller is a carbon nanotube. Thus, the function of the conductive film can be maintained more reliably, without losing conductivity even though deformation occurs at the time of extension or restoration.

Further, in the conductive film, it is preferable that the conductive film or the film substrate is extensible and restorable, and the residual distortion rate α of the conductive film or the film substrate, which is measured by the following test method, satisfies $0 \leq \alpha \leq 3\%$.

[Extension-Restoration Test]

An extension process is performed and then a restoration process is performed, under the following conditions in a tensile-compression tester based on ISO3384, by using a film piece (thickness: 50 μm, sample shape: dumbbell No. 6 (JIS K6251 and ISO37, measured portion width: 4 mm, and parallel part length: 25 mm)), and the residual distortion rate α is computed by the following calculation method.

Extension Process Condition:

Deflection correction is performed with a force of 0.05 N or smaller in order to remove deflection occurring when a test piece is attached to a gripping tool.

Test speed: 25 mm/min until extension of 0% to 25%

Temperature condition: 23° C.

Extension and Holding Process Condition:

Extension and holding condition: holding period of 5 minutes at extension of 25%

Temperature condition: 23° C.

Restoration Process Condition:
Test speed: 0.1 mm/min until a tensile force is 0±0.05 N
Temperature condition: 23° C.
The residual distortion rate calculation method: a distortion quantity is measured at a time point when the tensile force is 0±0.05 N in the restoration process, and the measured distortion quantity is set as the residual distortion rate α.

In the conductive film, it is preferable that the conductive film or the film substrate has stress relaxation properties, and the stress relaxation ratio R of the conductive film or the film substrate, which is measured by the following test method satisfies 30%≤R≤90%.

[Extension-Restoration Test]
An extension process is performed and then a restoration process is performed, under the following conditions in a tensile-compression tester based on ISO3384, by using a film piece (thickness: 50 μm, sample shape: dumbbell No. 6 (JIS K6251 and ISO37, measured portion width: 4 mm, and parallel part length: 25 mm)), and the residual distortion rate α is computed by the following calculation method.

Extension Process Condition:
Deflection correction is performed with a force of 0.05 N or smaller in order to remove deflection occurring when a test piece is attached to a gripping tool.
Test speed: 25 mm/min until extension of 0% to 25%
Temperature condition: 23° C.
Extension and Holding Process Condition:
Extension and holding condition: holding period of 5 minutes at extension of 25%
Temperature condition: 23° C.
Restoration Process Condition:
Test speed: 0.1 mm/min until a tensile force is 0±0.05 N
Temperature condition: 23° C.
Stress Relaxation Ratio Calculation Method:
In the extension process, a tensile force when the extension process is ended is measured shortly after when a film piece is extended until 25%, and the measured tensile force is set as an initial tensile force $F_{A0}$. Then, in the extension and holding process, a tensile force is measured after when a film piece is held 5 minutes at extension of 25%. The measured tensile force is set as $F_A(t_5)$. The stress relaxation ratio R is computed by the following expression.

$$R = \frac{F_{A0} - F_A(t5)}{F_{A0}} \times 100$$

With such a configuration, it is possible to provide a conductive film which has excellent restoration properties after extension and excellent stress relaxation properties, and in which conductivity is not lost even in deformation such as extension or restoration.

In the conductive film, it is preferable that the film substrate contains a thermosetting resin. Thus, it is possible to add thermal resistance or toughness.

Further, it is preferable that the film substrate includes an inorganic filler. Thus, it is possible to improve thermal resistance, thermal expansion, moisture resistance, and the like. In particular, a heat-time dimension change, for example, occurring when a circuit pattern of the conductive film is formed is suppressed, and thus it is possible to obtain a conductive film having highly-accurate circuit dimensions.

In the conductive film, it is preferable that the film substrate contains silicon as a constituent. Thus, when an unevenness shape is formed on the surface of the film substrate, it is possible to form unevenness which is finer and has a distinct difference in height.

Further, in the conductive film, it is preferable that the total light transmittance is 80% to 99%. Thus, the conductive film can be applied for a use as a transparent conductive film, for example.

Further, in the conductive film, it is preferable that surface resistance is equal to or smaller than 1000 Ω/sq. Thus, the conductive film can be applied for a use as a touch sensor, for example.

Further, a display, a touch panel, a touch sensor, and a solar cell including the conductive film are included in this disclosure. The conductive film according to the exemplary embodiment can be applied for various uses which can correspond to following a free-curved surface or large deformation.

The exemplary embodiment will be more specifically described below by using examples, and the scope of the embodiment is not limited thereto.

EXAMPLES

Firstly, various materials used in the example are as follows.
(Thermosetting Resin)
Polyrotaxane: ("A1000" manufactured by Advanced Softmaterials Inc.)
Epoxy resin ("JER1009" manufactured by Mitsubishi Chemical Corporation)
(Curing Agent)
Imidazole curing accelerator ("2E4MZ" manufactured by Shikoku Chemicals Corporation, 2-ethyl-4-methyl imidazole)
Isocyanate resin ("D-165N" manufactured by Mitsui Chemicals Inc.)
(Leveling Agent)
Silicon surfactant ("BYK-370" manufactured by BYK Japan Corporation)
(Silicon)
Nanosilica ("EC-2102" manufactured by Nissan Chemical Inc., Ltd.)
(Carbon Nanotube (CNT)-Containing Aqueous Solution)
SWCNT: IsoNanotubes-M (manufactured by NanoIntegris Technologies, Inc., CNT diameter of 1.7 nm, length of 1 μm)

Example 1-1 and Example 1-2

[1. Manufacturing Film Substrate]
Components were added to a solvent (methyl ethyl ketone) in mixing composition (parts by mass) shown in the following Table 1, so as to cause the solid concentration to be 40 mass %. The components were uniformly mixed, thereby a resin composition for a film substrate 1 was prepared.

Then, the obtained resin composition was applied onto a PET film (support) of 75 μm by a bar coater, and was dried at 100° C. for 10 minutes so as to remove the solvent. Then, heating and curing was performed at 170° C. for 60 minutes, and thus the film substrate 1 in which a resin film having a thickness of 50 μm was formed on the PET film was obtained. A film substrate 2 shown in the following Table 1 will be described in detail, in <Example 2-1 and Example 2-2> which will be described later.

TABLE 1

|  | Film substrate 1 | Film substrate 2 |
|---|---|---|
| Polyrotaxane A1000 | 100 | 100 |
| Epoxy resin JER1009 | 100 | 100 |
| Imidazole effect accelerator 2E4MZ | 1 | 1 |
| Isocyanate resin D-165N | 50 | 50 |
| Silicon surfactant BYK-370 | Provided | None |
| Nanosilica EC-2102 | 0 | 10 |

[2. Forming Unevenness Shape on Surface of Film Substrate]

Plasma treatment was performed on the surface (side on which the conductive layer is formed: an opposite surface of a support layer (PET film)) of the obtained film substrate. The plasma treatment was performed under conditions shown in the following Table 2, by using a vacuum plasma device (manufactured by SEMCO Corporation, PC-300). Thus, a film substrate having an unevenness shape on the surface was obtained. The value of Rz and the value of Sm of the obtained unevenness shape were measured in a manner that the length of a section parallel to a thickness direction of the film substrate was measured. The measurement was performed by a field-emission transmission electron microscope (below abbreviated as a TEM) ("JEM-2100F" manufactured by JEOL Ltd.). Table 2 shows results.

Figure 1B:
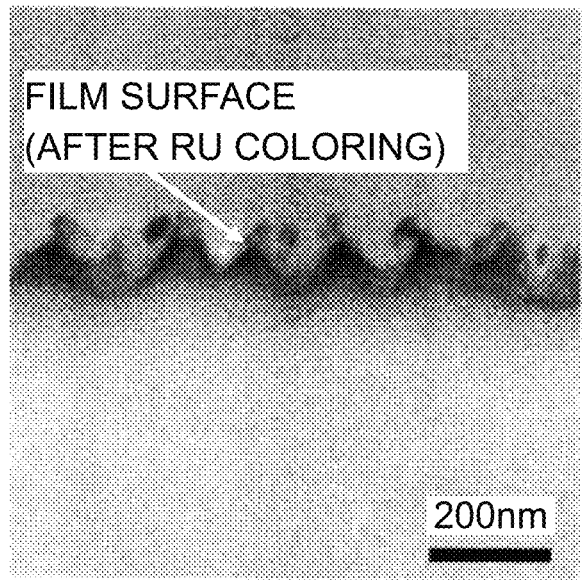
FIG. 1B is a diagram illustrating a TEM image of the film substrate in Example 1-2, after unevenness is formed by plasma treatment.

FIG. 1A illustrates a TEM image of the film substrate in Example 1-2 before plasma treatment. FIG. 1B illustrates a TEM image of the film substrate in Example 1-2 after plasma treatment is performed, and then unevenness is formed. In the images, the surface of the film substrate is black-colored by ruthenium tetroxide, and a lower side in the visual field corresponds to the film substrate. It is understood that unevenness having a depth of about 100 nm is formed by plasma treatment, from FIGS. 1A and 1B.

[3. Forming Conductive Layer]

A carbon nanotube (below abbreviated as a CNT) (SW-CNT: IsoNanotubes-M (manufactured by NanoIntegris Technologies, Inc.) was weighed. The carbon nanotube was put into a 5 wt % sodium dodecyl sulfate aqueous solution, and dispersion was performed for 24 hours by an ultrasonic wave. Thus, a CNT-containing aqueous solution having concentration of 200 ppm was obtained.

Then, the CNT-containing aqueous solution was applied onto one surface of the film substrate obtained in [1. Manufacturing Film Substrate], by a bar coater. Drying was performed at 120° C. for 30 minutes, so as to remove the solvent. Thus, a conductive film in which the thickness of a CNT layer (conductive layer) was 10 nm was obtained.

[4. Measuring Stress Relaxation Ratio R and Residual Distortion Rate α]

A film piece having a shape of dumbbell No. 6 (JIS K6251 and ISO37, measured portion width: 4 mm, and parallel part length: 25 mm) which had a thickness of 50 μm was cut from the obtained conductive film, and the film piece was used as a sample in the following evaluation.

[Extension-Restoration Test]

In an extension-restoration test used in the example, an extension process was performed, and then a restoration process was performed under the following conditions, by using samples in the example and a comparative example. Then, the stress relaxation ratio R and the residual distortion rate α were computed by the following calculation method.

Extension Process Condition:

Deflection correction is performed with a force of 0.05 N or smaller in order to remove deflection occurring when a test piece is attached to a gripping tool.

Test speed: 25 mm/min until extension of 0% to 25%

Temperature condition: 23° C.

Extension and Holding Process Condition:

Extension and holding condition: holding period of 5 minutes at extension of 25%

Temperature condition: 23° C.

Restoration Process Condition:

Test speed: 0.1 mm/min until a tensile force is 0±0.05 N

Temperature condition: 23° C.

Stress Relaxation Ratio Calculation Method:

In the extension process, a tensile force when the extension process is ended is measured shortly after when a film piece is extended until 25%, and the measured tensile force is set as an initial tensile force $F_{A0}$. Then, in the extension and holding process, a tensile force is measured after when a film piece is held 5 minutes at extension of 25%. The measured tensile force is set as $F_A(t_5)$. The stress relaxation ratio R is computed by the following expression.

$$R = \frac{F_{AO} - F_A(t5)}{F_{AO}} \times 100$$

The Residual Distortion Rate Calculation Method:

a distortion quantity was measured at a time point when the tensile force was 0±0.05 N in the restoration process, and the measured distortion quantity was set as the residual distortion rate α.

That is, using a tensile-compression tester compliant with ISO3384, and by using a film piece having a thickness of 50 μm, and a sample shape having a measured portion width of 4 mm, and a parallel part length of 25 mm which corresponds to dumbbell No. 6 specified JIS K6251 and ISO37, an extension process is performed, under the conditions where a deflection correction is performed with a force of 0.05 N or smaller in order to remove deflection occurring when the film piece is attached to a gripping tool, a test speed until extension of 0% to 25% is 25 mm/min, a temperature condition of 23° C. After the extension process is performed, an extension and holding process is performed under the conditions where an extension and holding condition is a holding period of 5 minutes at extension of 25% and a temperature condition is 23° C. After the extension and holding process is performed, a restoration process is performed under the conditions where a test speed until a tensile force is 0±0.05 N is 0.1 mm/min and a temperature condition is 23° C. In the extension process, an initial tensile force $F_{A0}$ is measured shortly after when a film piece is extended until 25%. In the extension and holding process, a tensile force $F_A(t_5)$ is measured after when a film piece is held 5 minutes at extension of 25%. A stress relaxation ratio R is computed by the following expression.

$$R = \frac{F_{AO} - F_A(t5)}{F_{AO}} \times 100$$

And that is, using a tensile-compression tester compliant with ISO3384, and by using a film piece having a thickness of 50 μm, and a sample shape having a measured portion width of 4 mm, and a parallel part length of 25 mm which corresponds to dumbbell No. 6 specified JIS K6251 and ISO37, an extension process is performed, under the conditions where a deflection correction is performed with a force of 0.05 N or smaller in order to remove deflection occurring when the film piece is attached to a gripping tool, a test speed until extension of 0% to 25% is 25 mm/min, a temperature condition is 23° C. After the extension process is performed, an extension and holding process is performed under the conditions where an extension and holding condition is a holding period of 5 minutes at extension of 25% and a temperature condition is 23° C. After the extension and holding process is performed, a restoration process is performed under the conditions where a test speed until a tensile force is 0±0.05 N is 0.1 mm/min and a temperature condition is 23° C. A residual strain ratio α is measured at a time point when tensile force is 0±0.05 N in the restoration process.

Table 2 shows the stress relaxation ratio R and the residual distortion rate α obtained in the above descriptions.

[5. Other Evaluation Tests]
[Measuring Surface Resistance Value]

A surface resistance value of the obtained conductive film was measured by a tester based on ISO3195. Table 2 shows results.

[Measuring Total Light Transmittance]

The total light transmittance of the obtained conductive film was measured by a tester based on ISO2556. Table 2 shows results.

[Measuring Electric Resistance Increase Rate in Extension and Contraction Operation]

The obtained conductive film was cut out in dimensions of the length of 6 cm, and the width of 5 mm. The cutout conductive film was set in a film stretching machine, so as to cause a distance between gripping tools to be 4 cm. Before the film was extended, when the film was extended at an extension rate of 25%, and when the gripping tools were brought back and the film was restored at the original position, the electric resistance value at a position at which a distance between terminals was 3 cm was measured by using a resistance meter (RM3548 manufactured by HIOKI E.E. Corporation). Table 2 shows results obtained by expressing the increased amount of electric resistance from the electric resistance value before the extension and contraction, in percentage. The results are shown as a resistance increase rate after film extension and a resistance increase rate after film restoration.

Table 2 shows results obtained by expressing an electric resistance value after this operation is repeated five times, and the increased amount of electric resistance from the electric resistance value measured before initial extension and contraction, in percentage. The results are shown as a resistance increase rate after five times of extension and contraction.

Comparative Example 1-1

A conductive layer was formed on a film substrate in a manner similar to that in Example 1-1, except that an unevenness shape was not formed on the surface of the film substrate. However, crawling occurred when coating with a dispersion liquid (CNT-containing aqueous solution) was performed, and thus obtaining a conductive film was not possible.

Comparative Example 1-2

Regarding a film substrate manufactured in a manner similar to that in Example 1-1, an unevenness shape was not formed on the surface of the film substrate, but the surface (side on which the conductive layer was formed: opposite surface of a support layer) of the film substrate was coated with an urethane resin ("HUX-561" manufactured by ADEKA Corporation). Heating and drying was performed at 100° C. for 15 minutes, and thus a film substrate in which an urethane layer having a thickness of 1 μm was provided on the surface was obtained. Then, a conductive layer was formed in a manner similar to that in Example 1-1. In this case, coating with the dispersion liquid well was possible, and thus a conductive film was obtained. Evaluation similar to that in Example 1-1 was performed on the obtained conductive film. Table 2 shows results.

Comparative Example 1-3

The surface (side on which the conductive layer was formed: opposite surface of a support layer) of the film substrate manufactured in a manner similar to that in Example 1-1 was subjected to corona treatment under conditions shown in Table 2. Thus, a film substrate having an unevenness shape on the surface was obtained. A conductive layer was formed on the film substrate in a manner similar to that in Example 1-1. In this case, coating with the dispersion liquid well was also possible, and thus a conductive film was obtained. Evaluation similar to that in Example 1-1 was performed on the obtained conductive film. Table 2 shows results.

TABLE 2

|  | Example 1-1 | Example 1-2 | Comparative Example 1-1 | Comparative Example 1-2 | Comparative Example 1-3 |
|---|---|---|---|---|---|
| Film substrate | Film substrate 1 | Film substrate 1 | Film substrate 1 | Film substrate 1 | Film substrate 1 |
| Conductive layer | CNT | CNT | CNT | CNT | CNT |
| Ten-point average roughness Rz (μm) | 0.06 | 0.1 | 0.01 | 0.01 | 0.1 |
| Average interval Sm of unevenness (μm) | 0.1 | 0.2 | >2 | >2 | >2 |
| Resistance increase rate after film extension and contraction (%) | 30 | 20 | — | 90 | 85 |
| A resistance increase rate after film restoration (%) | 20 | 15 | — | 90 | 85 |
| Resistance increase rate after five times of extension (%) | 35 | 26 | — | 110 | 110 |
| Residual distortion rate α (%) | 0.7 | 0.7 | — | 0.7 | 0.7 |
| Stress relaxation ratio R (%) | 30 | 30 | — | 30 | 30 |
| Surface resistance value (Ω/sq.) | 440 | 450 | — | 470 | 430 |

TABLE 2-continued

|  | Example 1-1 | Example 1-2 | Comparative Example 1-1 | Comparative Example 1-2 | Comparative Example 1-3 |
|---|---|---|---|---|---|
| Total light transmittance (%) | 88 | 88 | — | 88 | 88 |
| Conductive layer formation result | Good | Good | Coating poorness | Good | Good |
| Surface unevenness forming means | Plasma | Plasma | No treatment | No treatment | Corona |
| Treatment conditions | Ar partial pressure 10 Pa 250 W/2 minutes | Ar partial pressure 10 Pa 250 W/4 minutes | — | — | In atmosphere 300 W/2 minutes |

(Results and Consideration)

In Comparative Example 1-1, the surface of a film substrate flicked the dispersion liquid. Thus, forming a conductive layer was not possible, and a conductive film was not obtained. In Comparative Example 1-2 and Comparative Example 1-3, a conductive film was obtained, but a change of electric resistance at the time of extension and restoration was large. The conductive film obtained in Examples 1-1 and 1-2 had a result that a change of electric resistance even after extension and restoration was small, in comparison to the above result. Further, as described above, in Example 1-2, it was also confirmed that unevenness having a depth of about 100 nm was formed on the surface of the film substrate by plasma treatment, by a TEM image (FIGS. 1A and 1B).

With the above results, it was shown that it was possible to suppress the change of electric resistance at the time of extension and contraction (extension and restoration) by the effect of the unevenness shape on the surface of the film substrate to be small, even though a similar film substrate was used.

Example 2-1 and Example 2-2

[1. Manufacturing Film Substrate]

Components were added to a solvent (methyl ethyl ketone) in mixing composition (parts by mass) shown in the following Table 1, so as to cause the solid concentration to be 40 mass %. The components were uniformly mixed, thereby a resin composition for a film substrate 2 was prepared.

Then, the obtained resin composition was applied onto a PET film (support) of 75 μm by a bar coater, and was dried at 100° C. for 10 minutes so as to remove the solvent. Then, heating and curing was performed at 170° C. for 60 minutes, and thus the film substrate 2 in which a resin film having a thickness of 50 μm was formed on the PET film was obtained.

[2. Forming Unevenness Shape on Surface of Film Substrate]

The surface (side on which the conductive layer was formed: opposite surface of a support layer) of the obtained film substrate was subjected to plasma treatment under conditions shown in Table 3, by using an atmospheric plasma device ("direct type surface treating device" manufactured by AIR WATER Inc.). Thus, a film substrate having an unevenness shape on the surface was obtained.

[3. Forming Conductive Layer]

A conductive layer was formed by a method similar to that in Example 1-1, except that the film substrate to be used was the film substrate 2. Thus, a conductive film was formed.

[4. Evaluation]

Evaluation similar to that in Example 1-1 was performed on the obtained conductive film. Table 3 shows results.

Comparative Example 2-1

A conductive layer was formed on a film substrate in a manner similar to that in Example 2-1, except that an unevenness shape was not formed on the surface of the film substrate. However, crawling occurred when coating with a dispersion liquid (CNT-containing aqueous solution) was performed, and thus obtaining a conductive film was not possible.

Comparative Example 2-2

The surface (side on which the conductive layer was formed: opposite surface of a support layer) of the film substrate manufactured in a manner similar to that in Example 2-1 was subjected to plasma treatment under conditions shown in Table 3, by using a vacuum plasma device (PC-300 manufactured by SEMCO Corporation). Thus, a film substrate having an unevenness shape on the surface was obtained. Then, a conductive layer was formed in a manner similar to that in Example 2-1. In this case, coating with the dispersion liquid well was possible, and thus a conductive film was obtained. Evaluation similar to that in Example 2-1 was performed on the obtained conductive film. Table 3 shows results.

Comparative Example 2-3

A film substrate in which a surface unevenness shape was formed on the film substrate manufactured in a manner similar to that in Example 2-1, in an operation similar to that in Example 2-1 except that the treatment conditions were changed as shown in Table 3 was obtained. Then, a conductive layer was formed in a manner similar to that in Example 2-1. However, crawling occurred when coating with a dispersion liquid was performed, and thus a conductive film was not obtained.

TABLE 3

|  | Example 2-1 | Example 2-2 | Comparative Example 2-1 | Comparative Example 2-2 | Comparative Example 2-3 |
|---|---|---|---|---|---|
| Film substrate | Film substrate 2 | Film substrate 2 | Film substrate 2 | Film substrate 2 | Film substrate 2 |
| Conductive layer | CNT | CNT | CNT | CNT | CNT |
| Ten-point average roughness Rz (μm) | 0.4 | 0.1 | 0.01 | 0.02 | 0.7 |
| Average interval Sm of unevenness (μm) | 0.8 | 0.2 | >2 | 0.1 | 0.7 |
| Resistance increase rate after film extension and contraction (%) | 30 | 25 | — | 80 | — |
| A resistance increase rate after film restoration (%) | 20 | 20 | — | 80 | — |
| Resistance increase rate after five times of extension (%) | 38 | 29 | — | 130 | — |
| Residual distortion rate α (%) | 1.0 | 1.0 | 1.0 | 1.0 | 1.0 |
| Stress relaxation ratio R (%) | 40 | 40 | 40 | 40 | 40 |
| Surface resistance value (Ω/sq.) | 450 | 480 | — | 450 | — |
| Total light transmittance (%) | 87 | 86 | — | 88 | — |
| Conductive layer formation result | Good | Good | Coating poorness | Good | Coating poorness |
| Surface unevenness forming means | Plasma | Plasma | No treatment | Plasma | Plasma |
| Treatment conditions | Atmospheric pressure, oxygen concentration 1% | Atmospheric pressure, oxygen concentration 1% | None | Ar partial pressure 10 Pa | Atmospheric pressure, oxygen concentration 1% |
|  | 200 W/2 minutes | 200 W/1 minute | None | 250 W/4 minutes | 500 W/1.5 minutes |

(Results and Consideration)

Figure 2:
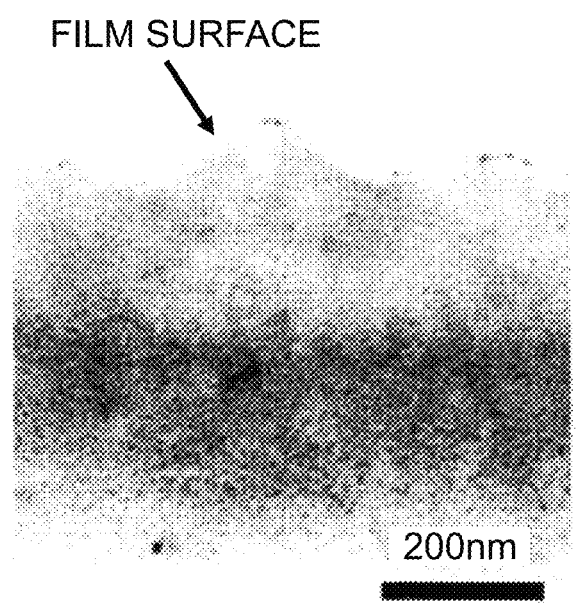
FIG. 2 is a diagram illustrating a TEM image of a film substrate in Example 2-2, after unevenness is formed by plasma treatment.

In Comparative Example 2-1 and Comparative Example 2-3, the surface of a film substrate flicked the dispersion liquid. Thus, forming a conductive layer was not possible, and a conductive film was not obtained. In Comparative Example 2-2, a conductive film was obtained, but a change of electric resistance at the time of extension and contraction was large. The change of electric resistance at the time of extension and restoration was large. The conductive film obtained in Examples 2-1 and 2-2 had a result that the change of electric resistance even after extension and restoration was small, in comparison to the above result. FIG. 2 illustrates a TEM image of the film substrate in Example 2-2 after plasma treatment is performed, and then unevenness is formed. As described above, it was also confirmed that unevenness was formed on the surface of the film substrate by plasma treatment, by a TEM image.

With the above results, it was shown that it was possible to suppress the change of electric resistance at the time of extension and contraction (extension and restoration) by the effect of the surface unevenness shape to be small, even though a similar film substrate was used.

Accordingly, it was confirmed that the conductive film in the exemplary embodiment showed excellent conductivity even after extension and after restoration, and the change of electric resistance even after extension and restoration was small.

What is claimed is:

1. A conductive film comprising:
    a film substrate; and
    a conductive layer formed on at least one surface of the film substrate,
    wherein the film substrate and the conductive film have elongation of 10% or more,
    ten-point average roughness Rz of a surface of the film substrate on at least a conductive layer side is 0.05 to 0.5 μm, and
    an average interval Sm of unevenness is 0.1 to 1 μm.
2. The conductive film according to the claim 1, wherein a thickness of the conductive layer is 5 μm to 1 μm.
3. The conductive film according to the claim 1, wherein the conductive layer is a conductive layer having a network structure by fibrous conductive nanofiller, and the fibrous conductive nanofiller is a carbon nanotube.
4. The conductive film according to the claim 1, wherein the conductive film or the film substrate is allowed to be extended and restored, and
    when, using a tensile-compression tester compliant with ISO3384, and by using a film piece having a thickness of 50 μm, and a sample shape having a measured portion width of 4 mm, and a parallel part length of 25 mm which corresponds to dumbbell No. 6 specified JIS K6251 and ISO37,
    an extension process is performed, under the conditions where a deflection correction is performed with a force of 0.05 N or smaller in order to remove deflection occurring when the film piece is attached to a gripping tool, a test speed until extension of 0% to 25% is 25 mm/min, a temperature condition is 23° C.,
    after the extension process is performed, an extension and holding process is performed under the conditions where an extension and holding condition is a holding period of 5 minutes at extension of 25% and a temperature condition is 23° C.,
    after the extension and holding process is performed, a restoration process is performed under the conditions where a test speed until a tensile force is 0±0.05 N is 0.1 mm/min and a temperature condition is 23° C., and
    a residual strain ratio α is measured at a time point when tensile force is 0±0.05 N in the restoration process, the residual strain ratio α of the conductive film or the film structure satisfies 0%≤α≤3%.

5. The conductive film according to the claim 1, wherein
the conductive film or the film substrate has stress relaxation properties, and when, using a tensile-compression tester compliant with ISO3384, and by using a film piece having a thickness of 50 μm, and a sample shape having a measured portion width of 4 mm, and a parallel part length of 25 mm which corresponds to dumbbell No. 6 specified JIS K6251 and ISO37, an extension process is performed, under the conditions where a deflection correction is performed with a force of 0.05 N or smaller in order to remove deflection occurring when the film piece is attached to a gripping tool, a test speed until extension of 0% to 25% is 25 mm/min, a temperature condition of 23° C., after the extension process is performed, an extension and holding process is performed under the conditions where an extension and holding condition is a holding period of 5 minutes at extension of 25% and a temperature condition is 23° C., after the extension and holding process is performed, a restoration process is performed under the conditions where a test speed until a tensile force is 0±0.05 N is 0.1 mm/min and a temperature condition is 23° C., in the extension process, an initial tensile force $F_{A0}$ is measured shortly after when a film piece is extended until 25%, and in the extension and holding process, a tensile force $F_A(t_5)$ is measured after when a film piece is held 5 minutes at extension of 25%, and a stress relaxation ratio R is computed by the following expression:

$$R = \frac{F_{AO} - F_A(t5)}{F_{AO}} \times 100 \qquad \text{Expression 1}$$

the stress relaxation ratio R of the conductive film or the film substrate satisfies 30%≤R≤90%.

6. The conductive film according to the claim 1, wherein the film structure contains a thermosetting resin.

7. The conductive film according to the claim 1, wherein the film structure contains an inorganic filler.

8. The conductive film according to the claim 1, wherein the film substrate contains silicon as a constituent.

9. The conductive film according to the claim 1, wherein total light transmittance is 80% to 99%.

10. The conductive film according to the claim 1, wherein surface resistance is equal to or smaller than 1000 Ω/sq.

11. A touch panel comprising:
the conductive film according to the claim 1.

12. A display comprising:
the conductive film according to the claim 1.

13. A touch sensor comprising:
the conductive film according to the claim 1.

14. A solar cell comprising:
the conductive film according to the claim 1.

\* \* \* \* \*